(12) United States Patent
Liu et al.

(10) Patent No.: US 8,529,136 B2
(45) Date of Patent: Sep. 10, 2013

(54) HIGH TEMPERATURE BALL BEARING

(75) Inventors: Xiao-Jun Liu, Camas, WA (US); Mark Chou, Vancouver, WA (US)

(73) Assignee: Wafertech, LLC, Camas, WA (US)

( * ) Notice: Subject to any disclaimer, the term of this patent is extended or adjusted under 35 U.S.C. 154(b) by 307 days.

(21) Appl. No.: 12/384,060

(22) Filed: Mar. 30, 2009

(65) Prior Publication Data
US 2010/0247280 A1 Sep. 30, 2010

(51) Int. Cl.
*F16C 33/32* (2006.01)

(52) U.S. Cl.
USPC ............ 384/492; 74/490.05; 74/490.06; 384/493; 384/521; 384/557; 384/905; 384/907.1; 414/744.5; 901/28; 901/29

(58) Field of Classification Search
USPC ............... 414/744.5; 901/28, 29; 74/490.05, 74/490.06; 384/476, 492, 493, 521, 557, 384/905, 907.1
See application file for complete search history.

(56) References Cited

U.S. PATENT DOCUMENTS

| | | | |
|---|---|---|---|
| 5,139,396 A | 8/1992 | Suzuki et al. | |
| 5,904,426 A * | 5/1999 | Tsuru et al. | 384/462 |
| 6,443,624 B1 * | 9/2002 | Knepper et al. | 384/492 |
| 6,505,974 B2 | 1/2003 | Giesler et al. | |
| 6,568,858 B2 * | 5/2003 | Tanimoto et al. | 384/492 |
| 6,746,156 B2 | 6/2004 | Giesler et al. | |
| 7,044,644 B2 * | 5/2006 | R et al. | 384/492 |
| 7,175,349 B2 * | 2/2007 | Sakamoto | 384/544 |
| 7,503,697 B2 * | 3/2009 | Tsuji et al. | 384/476 |
| 2001/0030476 A1 | 10/2001 | Brown | |
| 2006/0182376 A1 * | 8/2006 | Burwell | 384/492 |
| 2006/0245960 A1 * | 11/2006 | Schooling et al. | 417/423.12 |
| 2008/0019816 A1 * | 1/2008 | Sato | 414/744.4 |
| 2009/0304318 A1 * | 12/2009 | Konno et al. | 384/492 |

* cited by examiner

*Primary Examiner* — Scott Lowe
(74) *Attorney, Agent, or Firm* — Duane Morris LLP

(57) ABSTRACT

A ball bearing having external surfaces coated with ceramic materials is provided. The raceways of the ball bearing may advantageously be formed of metal such as stainless steel. The ceramic coating acts as an insulator increasing the resistance of the ball bearing to heat within the ball bearing environment. The balls within the raceway of the ball bearing may advantageously be coated with a lubricant to decrease friction in the ball bearing because the insulating ceramic coating prevents the environmental heat from causing the degradation of the lubricant.

18 Claims, 5 Drawing Sheets

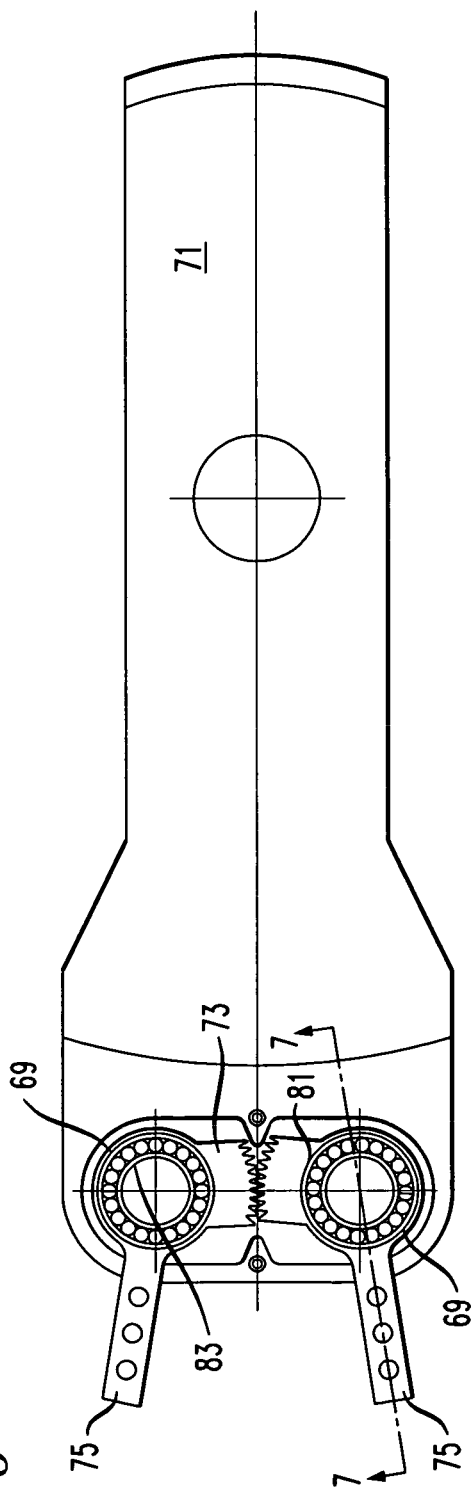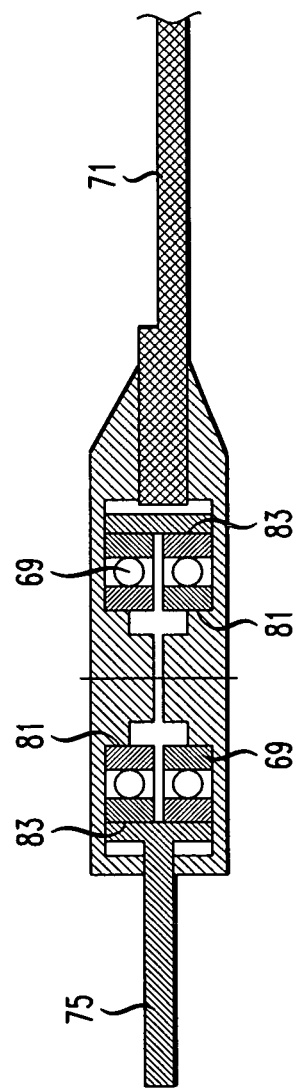

HIGH TEMPERATURE BALL BEARING

FIELD OF THE INVENTION

The present invention is generally related to high temperature ball bearings, and more particularly to ball bearings coated with a ceramic, such as may be suitable for use in the electronics industry, and more particularly in the semiconductor manufacturing industry.

BACKGROUND

Mechanical bearings find many applications in various industries and are used in components that provide mechanical movement of parts and other components, within or to a manufacturing apparatus. In the semiconductor manufacturing industry, mechanical bearings are used in mechanical wafer transfer mechanisms that utilize robot arms and wafer gripping or receiving members to pick up and transfer the substrates to and from desired positions in the substrate processing manufacturing tool. These mechanical wafer transfer operations are highly precise operations and require the robot arms to be properly aligned and to move accurately. Deviation in the movement of the robot arm will cause its position to be out of alignment. When a wafer arm which is out of alignment or which moves improperly, picks up and transfers a semiconductor substrate, i.e. wafer, the transfer operation may result in scratching or breakage of the wafer, or any other of a number of detrimental aspects. To avoid the aforementioned problems which may result in contamination in the wafer processing apparatus, the movement of the robot arm must be smooth and accurate. Mechanical bearings are used to provide such accurate movement.

Mechanical bearings used for robot arms or other wafer transfer mechanisms typically consist of two metal rings filled with metallic or ceramic balls. The two metal rings are called the inner and outer raceways. The balls disposed in the raceways allow the raceways to rotate smoothly with respect to one another. A lubricant may be added to the raceways to coat the balls to reduce friction during movement. In many applications, however, the wafer transfer mechanism including the ball bearings, is exposed to extremely high temperatures that can cause the lubricant to degrade. As the lubricant degrades, it undergoes a chemical transformation that causes the lubricant to solidify. As the lubricant solidifies, the friction between the balls and the metal rings increases, rendering the robot arm movement less smooth, and less accurate. Additionally, the solidified lubricant can result in particles that may be released into the microenvironment of the transfer mechanism, directly onto the wafer or into the chamber or other processing member in which the wafer is processed. In many cases, the solidified lubricant may build up in particular areas causing severe particulate problems at those locations.

It would therefore be useful to provide a bearing that may be used in the semiconductor manufacturing industry and does not include the above described shortcomings.

SUMMARY OF THE INVENTION

To address these and other needs, and in view of its purposes, provided is a ball bearing with an outer raceway formed of a metal and an inner raceway formed of a metal. The ball bearing includes a plurality of rolling elements disposed between the inner and outer raceways. The inner raceway includes an inwardly facing external surface with a ceramic formed thereon and the outer raceway includes an outwardly facing external surface with either the same or a further ceramic formed thereon.

According to another aspect, provided is a robot arm for transporting wafers within or to or from a semiconductor processing tool. The robot arm comprises a wafer transfer blade member that is pivotable about a pivot member including a ball bearing. The ball bearing comprises an outer raceway formed of metal, an inner raceway formed of metal and a plurality of rolling elements disposed between the inner and outer raceways. The inner raceway includes an inwardly facing external surface coated with a ceramic and the outer raceway includes an outwardly facing external surface coated with either the same or a further ceramic.

According to another aspect, provided is a transfer mechanism for transporting wafers within or to or from a semiconductor processing tool. The transfer mechanism comprises a wafer transfer blade pivotally coupled to a duality of robot arms through respective pivot members. Each pivot member includes a ball bearing comprising an outer raceway formed of stainless steel, an inner raceway formed of stainless steel, and a plurality of rolling elements disposed between the inner and outer raceways. The inner raceway includes an inwardly facing external surface coated with a first layer of ceramic; and the outer raceway includes an outwardly facing external surface coated with a second layer of one of the ceramic and a further ceramic.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 6 is a plan view of a wafer transfer blade with multiple exemplary ball bearings of the invention;

FIG. 7 is cross-sectional view taken along line 7-7 of FIG. 6; and

DETAILED DESCRIPTION

The present invention provides a heat resistant ceramic material disposed on at least one outer surface of a bearing. The bearing may be made of metal or other suitable materials. The heat resistant ceramic coating reduces the heat transferred from the environment to the ball bearings, particularly to the inner raceways and balls of the ball bearings. This reduced heat transfer enables the balls to be coated with a lubricant to help provide a smooth movement with minimal friction because the ceramic coating acts as an insulator and prevents the lubricant from being heated to a temperature that degrades the lubricant. Although the following description describes two and four point ball bearings in which the inner and outer raceways may advantageously be formed of a metal material such as stainless steel, such is intended to be exemplary only and the aspects of the present invention can be similarly applied to other ball bearings. The same is true for the exemplary applications provided for the exemplary ball bearings. Although discussed with respect to the exemplary application in which the ball bearings are used in wafer transfer mechanisms such as robot arms to effectuate movement of semiconductor wafers in the semiconductor manufacturing industry, the ball bearings may be used in any of various other industries, advantageously in high temperature, high vacuum applications such as may be used to manufacture parts for spacecrafts or artificial satellites.

Figure 1:
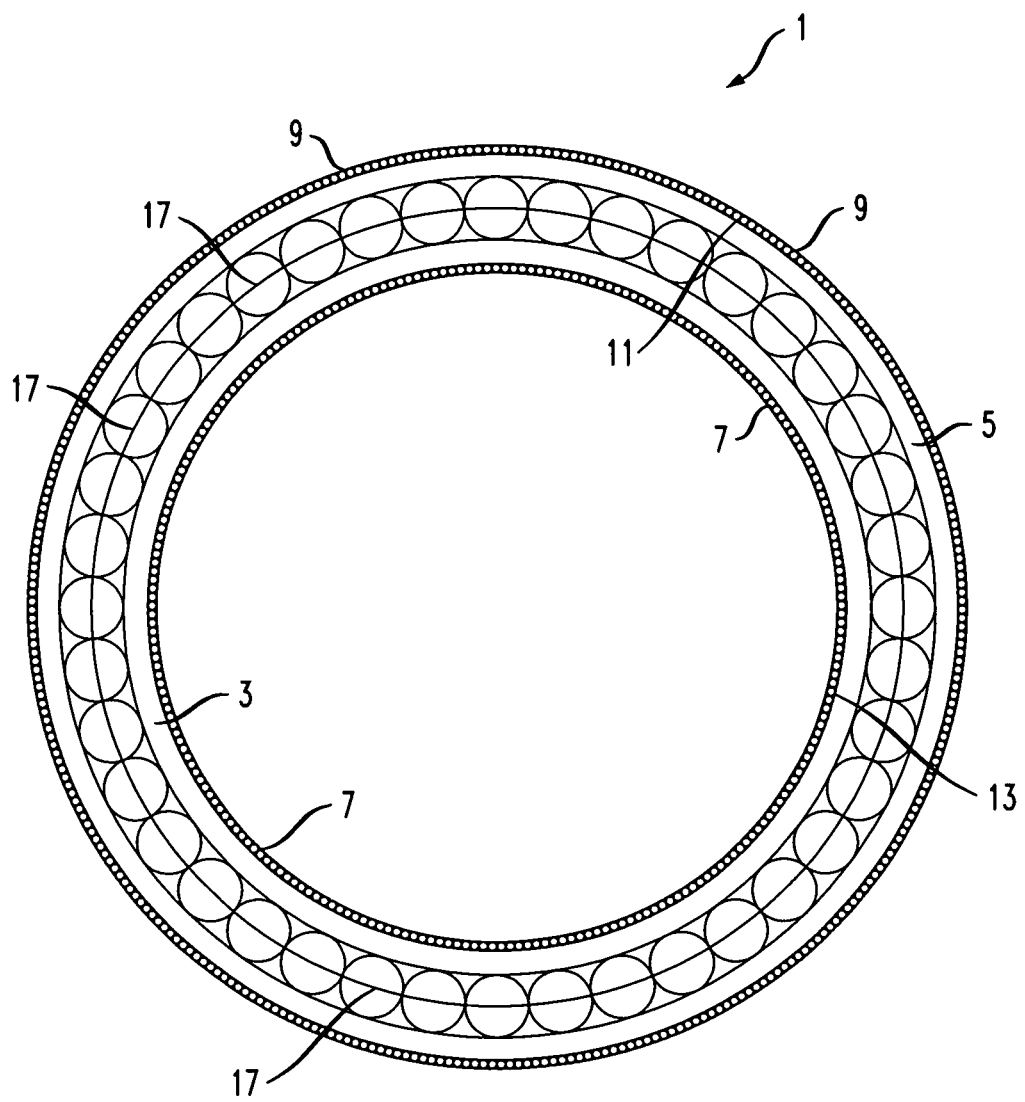
FIG. 1 is a cross-sectional view taken from a top orientation of an exemplary ball bearing according to the invention.
Figure 2:
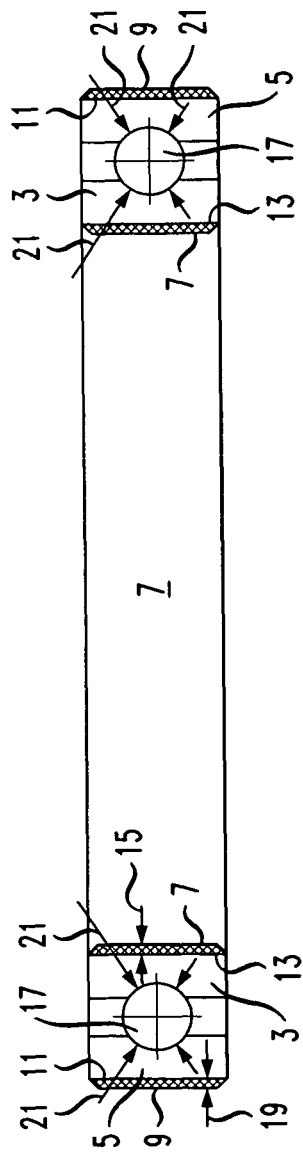
FIG. 2 is a side cross-sectional view of an exemplary ball bearing according to the invention.

Now referring to FIGS. 1 and 2, ball bearing 1 includes inner raceway 3 and outer raceway 5. Inner raceway 3 and outer raceway 5 may each be formed of various metals such as stainless steel, ceramics, or other suitable materials. Inner raceway 3 includes inwardly facing external surface 13 with ceramic 7 disposed thereon and outer raceway 5 includes outwardly facing external surface 11 with ceramic 9 disposed thereon. According to one exemplary embodiment, ceramics 7 and 9 may be the same and according to other exemplary embodiments, they may be formed of different materials. According to one exemplary embodiment, ceramics 7 and 9 may be a coating produced by conventional coating means and in other exemplary embodiments, ceramics 7 and 9 may be of a different morphology and may be formed using other techniques although hereinafter such ceramics will generally be referred to as coatings. According to one exemplary embodiment, either or both of ceramics 7, 9 may be formed of an $Al_xO_y$ such as $Al_2O_3$ (alumina), $Si_xN_y$, $Cr_xO_y$, or other suitable ceramic materials. The ceramic material is chosen to include a lower coefficient of thermal conductivity than the raceways such that the internal components of the ball bearing are resistant to being elevated to the heat in the environment of the ball bearing, i.e. the ceramic acts as an insulator. According to one exemplary embodiment, ceramics 7 and 9 may be continuous layers and take on the form of a layer having respective thicknesses 15, 19 that may range from about 0.5 mm to 1 mm, but other thicknesses may be used in other exemplary embodiments and the thicknesses will depend upon the dimensions of ball bearing 1. According to yet another exemplary embodiment, only one of the two external surfaces 11, 13 will be coated with a ceramic.

Balls 17 are disposed within and between inner and outer raceways 3, 5. According to one exemplary embodiment, balls 17 may be formed of a ceramic and according to another exemplary embodiment, balls 17 may be formed of a metal such as stainless steel. According to yet another exemplary embodiment, balls 17 may include both ceramic and stainless steel balls. In one particular embodiment, every other ball may be formed of stainless steel with interceding balls made of ceramic. According to another exemplary embodiment, the mixture of balls that constitute balls 17 may constitute a 1-3:1 ratio of ceramic balls: stainless steel balls. Other arrangements and balls made of other materials may be used in other exemplary embodiments.

In FIG. 2, exemplary bearing 1 is a four-point bearing, i.e., there are four contact points between ball 17 and the respective inner surfaces of raceways 3, 5. The contact points are indicated by arrows 21.

Figure 3:
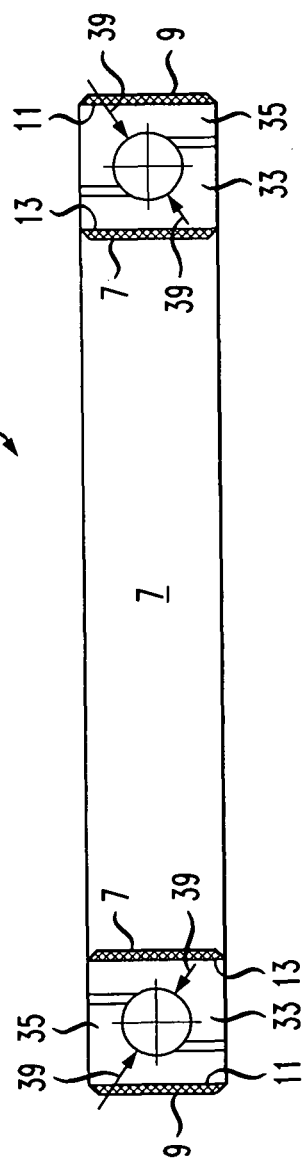
FIG. 3 is a side cross-sectional view of another exemplary ball bearing according to the invention.

FIG. 3 is a cross-sectional view showing exemplary ball bearing 31 which is a two-point bearing. Ball bearing 31 includes inner raceway 33 and outer raceway 35. Disposed between inner and outer raceways 33 and 35 are balls 17. Inner raceway 33 includes inwardly facing external surface 13 coated by ceramic 7 and outer raceway 35 includes outwardly facing external surface 11 coated with ceramic 9. Inner raceway 33 and outer raceway 35, may each be formed of stainless steel, ceramics, or other suitable materials. It can be seen that in this embodiment, ball 17 includes only two contact points, indicated by arrows 39, with the respective raceways. It can be further seen that inwardly facing external surface 13 is generally parallel to opposed outwardly facing external surface 11 in each of the embodiments illustrated. Although not illustrated, the ball bearing of FIGS. 2 and 3 may also include a cover, advantageously made of a suitable metal such as stainless steel that extends annularly and is disposed over or under the raceways and generally orthogonal to external surfaces 11 and 13.

Figure 4:
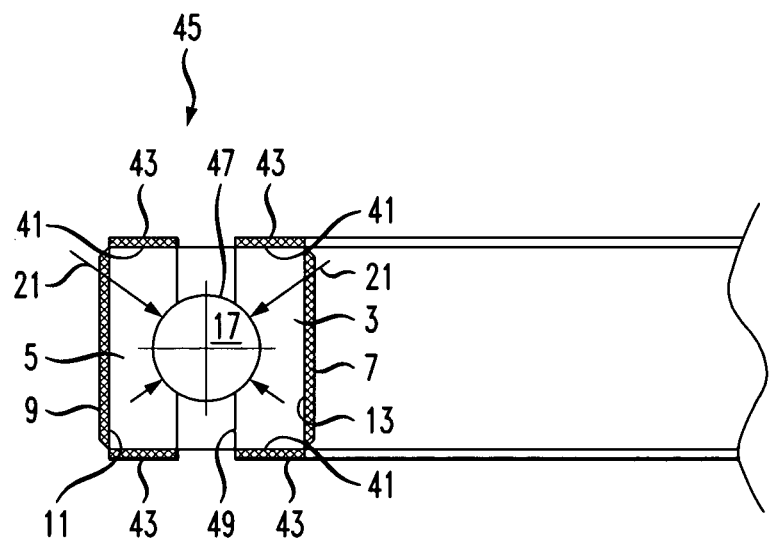
FIG. 4 is an expanded side cross-sectional view of a portion of an exemplary ball bearing showing another aspect of the invention.

Now turning to FIG. 4 which illustrates a 2-point bearing such as shown in FIG. 2, a further aspect of the invention is illustrated. Each of raceways 3 and 5 include surfaces 41 that are generally orthogonal to inwardly facing external surface 13 and outwardly facing external surface 11. It can be appreciated that, from top direction 45, surfaces 41 form a pair of generally concentric annular surfaces. In the illustrated embodiment, each of the annular surfaces 41 is coated with ceramic 43 which may be $Al_2O_3$, $Al_xO_y$, SiN, $Cr_xO_y$, or other suitable ceramics although only one such annular surface 41 may be so coated in other exemplary embodiments. Ceramic 43 may be the same or different than either or both of ceramics 7 and 9. Ceramic 43 will generally be a continuous layer and will include a thickness that may range from 0.5 to 1 mm but other thicknesses may be used in various other exemplary embodiments. One advantageous aspect of the present invention is that at least one of surfaces 47 of ball 17 and internal surfaces 49, 51 of raceways 3, 5, respectively may be coated with a lubricant to reduce friction as ball 17 travels within the raceways without fear of the lubricant degrading and solidifying due to excessive heat. Lubricants are well known to be substances, such as grease or oil, that reduce friction when applied as a surface coating to moving parts. The lubricant that may be coated on one of the aforementioned surfaces may be a grease or an oil. As such, in one embodiment, at least one of surface 47 of ball 17 and internal surfaces 49, 51 of raceways 3, 5, respectively, is coated with a grease and in another embodiment, at least one of surface 47 of ball 17 and internal surfaces 49, 51 is coated with an oil. Various lubricants suitable for high vacuum applications may be used and include but are not limited to Krytox manufactured by DuPont® and Nyetorr manufactured by Nye Lubricants Inc. Krytox® oils and greases are available as exceptional lubricants and in one embodiment, a Krytox® oil is used as the aforementioned lubricant coating, and in another embodiment, a Krytox® grease is used the aforementioned lubricant coating. Other suitable lubricants may be used in other exemplary embodiments. Because of the ceramic coating(s), excessive temperatures such as temperatures that exceed 200° C. may be experienced in the microenvironment of the ball bearing without causing the lubricant to degrade. The ceramic coating(s) act as an insulator to prevent the ball bearing from attaining the excessive temperatures in the environment.

Figure 5:
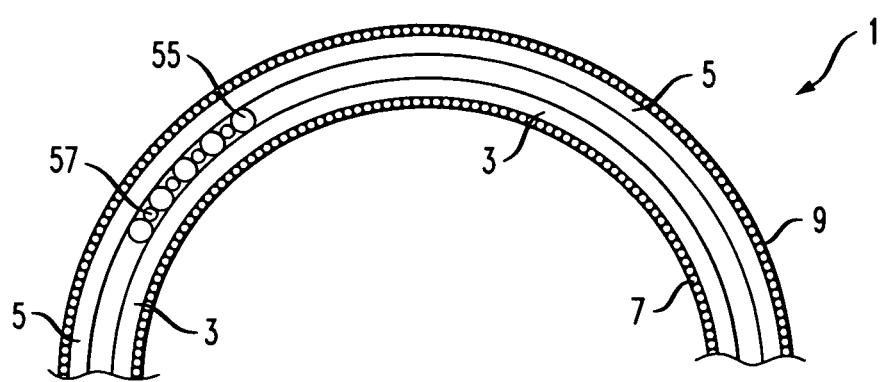
FIG. 5 is a cross-sectional view of a portion of an exemplary ball bearing taken from a top orientation and illustrating another aspect of the invention.

FIG. 5 is a cut-away cross-sectional view of a ball bearing illustrating another aspect of the invention. As previously described, ball bearing 1 is formed of inner raceway 3 coated with ceramic 7 on inwardly facing external surface 13 and raceway 5 includes outwardly facing external surface 11 coated with ceramic 9. Within the raceways are a plurality of rolling elements including larger ceramic balls 55 and smaller stainless steel spacer balls 57. Although illustrated in a 1:1 ratio, this is intended to be exemplary only and in other exemplary embodiments, the ratio of ceramic balls 55:smaller stainless steel spacer balls 57 may be 3:1 or greater.

FIG. 6 illustrates two exemplary ball bearing arrangements in one exemplary apparatus. FIG. 6 illustrates wafer blade 71 upon which a semiconductor substrate, i.e. wafer is received and transported. Movement is enabled for wafer blade 71 by virtue of the two illustrated ball bearings 69 and gears 73 and pivotable robot arms 75 that act in concert to provide motion to wafer blade 71. Wafer blade 71 is pivotally coupled to each robot arm 75 via the respective illustrated ball bearing 69 which may each overlie a further ball bearing as will be shown in FIG. 7. Each of wafer blade 71 and robot arms 75 pivot about a common pivot point. Pivotable robot arms 75 act in tandem and may further pivot about external points not shown and by virtue of gears 73, enable translational or angular movement of wafer blade 71. Ball bearings 69 may be any of the previously described ball bearings such as but not limited to ball bearing 1 and ball bearing 31. One or both of external surfaces 81 and 83 of ball bearing 69 may be coated with ceramics as previously described.

FIG. 7 is a cross-sectional view such as may be taken along line 7-7 of FIG. 6 according to an exemplary embodiment in which two bearings 69 are used in tandem, in particular they are stacked over one another to provide more robust motion and a more durable device. The stainless steel or other metal ball bearings coated with ceramics are able to provide strength and easily sustain the load provided by a semiconductor substrate, i.e. wafer, on wafer blade 71. Pure ceramic ball bearings would likely not be able to sustain the load and with the load bearing ability of wafer blade 71 compromised, would likely result in errors and other misalignments in the wafer transferring operations.

Figure 8:
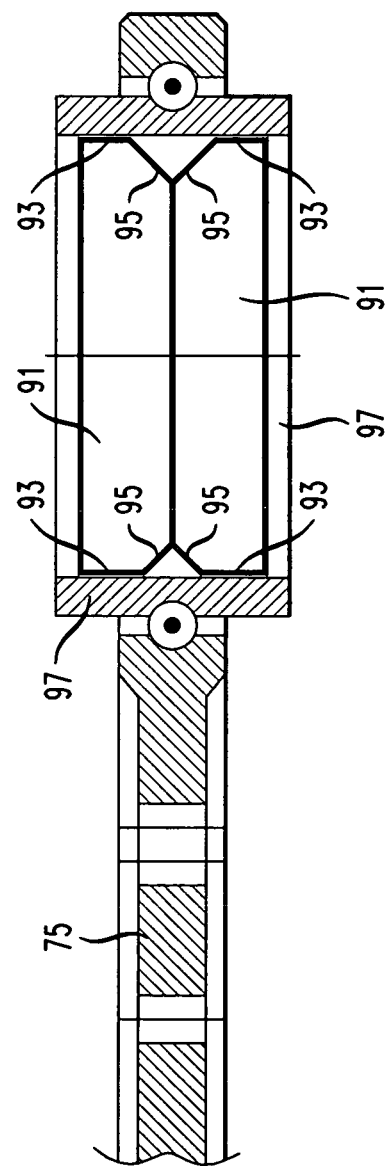
FIG. 8 is a cross-sectional side view of two ball bearings in a housing illustrating another aspect of the invention.

FIG. 8 shows another aspect of the invention and includes two ball bearings 91 in relation to exemplary pivotable robot arm 75. The details of ball bearings 91 are omitted but ball bearings 91 may include features of any of the previously described ball bearings and may include one or more of the external surfaces coated with a ceramic. Outwardly-facing external surfaces 93, which may be coated with a ceramic, include beveled edges 95 which are advantageously positioned along the interface between the two ball bearings 91. Ball bearings 91 are each disposed within housing 97. Housing 97 may be evacuated to vacuum using conventional pumping down methods and the inventors have found that the adjacent beveled surfaces reduce turbulent and un-balanced forces within housing 97 that lead to particle generation and redistribution as well as misalignment and improper positioning of ball bearings 91.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A ball bearing comprising:
   an outer raceway formed of metal;
   an inner raceway formed of metal;
   a plurality of rolling elements disposed between said inner and outer raceways, wherein said plurality of rolling elements comprise metal balls and ceramic balls present in a ratio of about 1:2-3 and said metal balls are smaller than said ceramic balls,
   said inner raceway including an inwardly facing external surface with a first layer of ceramic disposed thereon;
   said outer raceway including an outwardly facing external surface with a second layer of a further ceramic disposed thereon; and
   said raceways including respective internal surfaces formed of said metal and including an oil or grease lubricant coating thereon.

2. The ball bearing as in claim 1, wherein said ceramic comprises SiN and each of said outer raceway and said inner raceway is formed of stainless steel.

3. The ball bearing as in claim 1, wherein each of said outer raceway and said inner raceway is formed of stainless steel and said oil or grease lubricant comprises oil.

4. The ball bearing as in claim 1, wherein at least one of said inner and outer raceways includes a set of opposed side annular surfaces with one of said ceramic and said further ceramic disposed thereon.

5. The ball bearing as in claim 4, wherein each of said side annular surfaces is disposed generally orthogonal to said inwardly facing external surface and said outwardly facing external surface.

6. The ball bearing as in claim 1, wherein said external surfaces are generally parallel in cross-section and are arranged concentrically with respect to one another.

7. The ball bearing as in claim 1, wherein said ball bearing is a 4-point ball bearing.

8. The ball bearing as in claim 1, wherein said ball bearing is a 2-point ball bearing.

9. The ball bearing as in claim 1, further comprising said oil or grease lubricant further coated on said plurality of rolling elements.

10. The ball bearing as in claim 1, wherein said first layer and said second layer are each continuous layers and include a thickness less than about 1 mm.

11. The ball bearing as in claim 1, further comprising a housing within which said ball bearing and a further said ball bearing are disposed adjacent one another and arranged such that respective inner surfaces are essentially coplanar, wherein adjacent edges of said respective outwardly facing external surfaces are beveled.

12. A transfer mechanism for transporting wafers within or to or from a semiconductor processing tool, said transfer mechanism comprising:
a wafer transfer blade member, pivotable about at least one pivot member including a ball bearing comprising:
an outer raceway formed of stainless steel;
an inner raceway formed of stainless steel;
a plurality of rolling elements disposed between said inner and outer raceways, said plurality of rolling elements comprising metal balls and ceramic balls present in a ratio of about 1:2-3, said metal balls being smaller than said ceramic balls,
said inner raceway including an inwardly facing external surface with a first layer of a ceramic disposed thereon;
said outer raceway including an outwardly facing external surface with a second layer of a further ceramic disposed thereon; and
said raceways including respective internal surfaces formed of said stainless steel and including an oil or grease lubricant coating thereon, wherein said ceramic comprises $Cr_xO_y$ and said further ceramic comprises one of $Al_2O_3$, $Al_xO_y$ and SiN.

13. The transfer mechanism as in claim 12, wherein each said pivot member further includes a further said ball bearing disposed adjacent said ball bearing and arranged such that respective inner surfaces and respective outer surfaces are essentially coplanar, wherein each of said ball bearing and said further ball bearing are disposed within a housing and each of adjacent opposed edges of said respective outwardly facing external surfaces, is beveled.

14. The transfer mechanism as in claim 13, wherein said oil or grease lubricant coating is disposed directly on said internal surfaces formed of said stainless steel.

15. The transfer mechanism as in claim 12, wherein said oil or grease lubricant comprises oil.

16. A transfer mechanism for transporting wafers within or to or from a semiconductor processing tool, said transfer mechanism comprising:
a wafer transfer blade pivotally coupled to a duality of robot arms through respective pivot members, said duality of robot arms meshing with each other through respective gears, each pivot member including a ball bearing comprising:
an outer raceway formed of metal;
an inner raceway formed of metal;
a plurality of rolling elements disposed between said inner and outer raceways,
said inner raceway including an inwardly facing external surface coated with a first layer of ceramic;
said outer raceway including an outwardly facing external surface coated with a second layer of a further ceramic; and
each said internal surface formed of said metal and including an oil or grease lubricant coating thereon.

17. The transfer mechanism as in claim 16, wherein each said pivot member further includes a further said ball bearing disposed adjacent said ball bearing and arranged in a housing such that respective inner surfaces and respective outer surfaces are aligned and each of adjacent opposed edges of said respective outwardly facing external surfaces, is beveled.

18. The transfer mechanism as in claim 16, wherein said metal comprises stainless steel, said ceramic comprises $Cr_xO_y$ and said further ceramic comprises SiN and each of said inner and outer raceways includes a set of opposed side annular surfaces with one of said ceramic and said further ceramic disposed thereon.

* * * * *